(12) United States Patent
Cao

(10) Patent No.: US 8,204,733 B2
(45) Date of Patent: Jun. 19, 2012

(54) POWER TESTING APPARATUS FOR UNIVERSAL SERIAL BUS INTERFACE

(75) Inventor: Xiang Cao, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 956 days.

(21) Appl. No.: 12/192,092

(22) Filed: Aug. 14, 2008

(65) Prior Publication Data
US 2009/0326905 A1    Dec. 31, 2009

(30) Foreign Application Priority Data
Jun. 26, 2008    (CN) .......................... 2008 1 0302364

(51) Int. Cl.
*G06F 9/445*    (2006.01)
*G06F 3/00*    (2006.01)
(52) U.S. Cl. .............. 703/21; 703/25; 703/28; 717/140; 713/185; 702/117; 710/300; 323/318
(58) Field of Classification Search ............ 703/28, 703/6, 21, 25; 713/185; 717/140; 439/610; 702/117; 710/300; 323/318
See application file for complete search history.

(56) References Cited

U.S. PATENT DOCUMENTS
| 6,691,201 | B1 * | 2/2004 | Williams et al. ............. 710/315 |
| 2007/0077817 | A1 * | 4/2007 | Guo ............................. 439/610 |
| 2007/0220499 | A1 * | 9/2007 | Bannatyne et al. .......... 717/140 |
| 2008/0235514 | A1 * | 9/2008 | Walker .......................... 713/185 |

FOREIGN PATENT DOCUMENTS
CN    101135986 A    3/2008
* cited by examiner

*Primary Examiner* — Thai Phan
(74) *Attorney, Agent, or Firm* — Altis Law Group, Inc.

(57) ABSTRACT

A power testing apparatus for a USB interface includes first and second USB interfaces, and a simulation apparatus. The simulation apparatus includes a first voltage regulator, first and second resistors, and a load resistor. The first USB interface is configured to connect to a circuit board. The second USB interface is configured to connect to a USB device. The first voltage regulator includes input, output, and adjusting terminals. The first resistor is connected between the output terminal and the adjusting terminal. The second resistor is connected between the adjusting terminal and ground. The load resistor is connected to the output terminal and ground. Signal pins of the first USB interface are connected to signal pins of the second USB interface. A voltage pin of the first USB interface is connected to a voltage pin of the second USB interface and the input terminal.

10 Claims, 2 Drawing Sheets

POWER TESTING APPARATUS FOR UNIVERSAL SERIAL BUS INTERFACE

BACKGROUND

1. Field of the Invention

The present invention relates to testing apparatuses and, especially, to a power testing apparatus for a universal serial bus (USB).

2. Description of Related Art

Nowadays, USB technology is broadly applied to various communication solutions and becomes more and more important. Before selling or using electronic devices having USB ports, the USB ports need to be tested. A related-art method for testing the USB ports is using some USB devices such as USB mouses, USB keyboards, USB hard disk drives, etc., directly connected to the USB ports, and inspecting working status of the USB devices to judge whether the USB port is good or not. However, these USB devices may not draw enough power to properly test the USB port.

What is desired, therefore, is to provide a power testing apparatus which can properly test USB ports of an electronic device.

DETAILED DESCRIPTION

Figure 1:
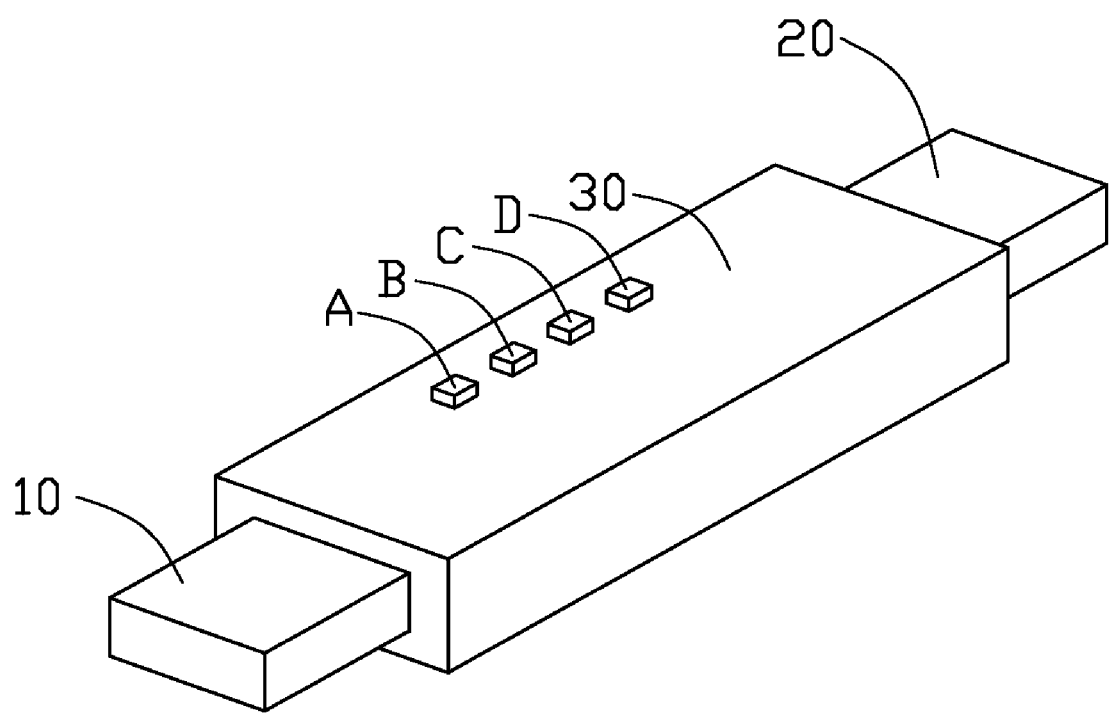
FIG. 1 is a schematic, isometric diagram of a power testing apparatus for USB interface in accordance with an exemplary embodiment of the present invention.
Figure 2:
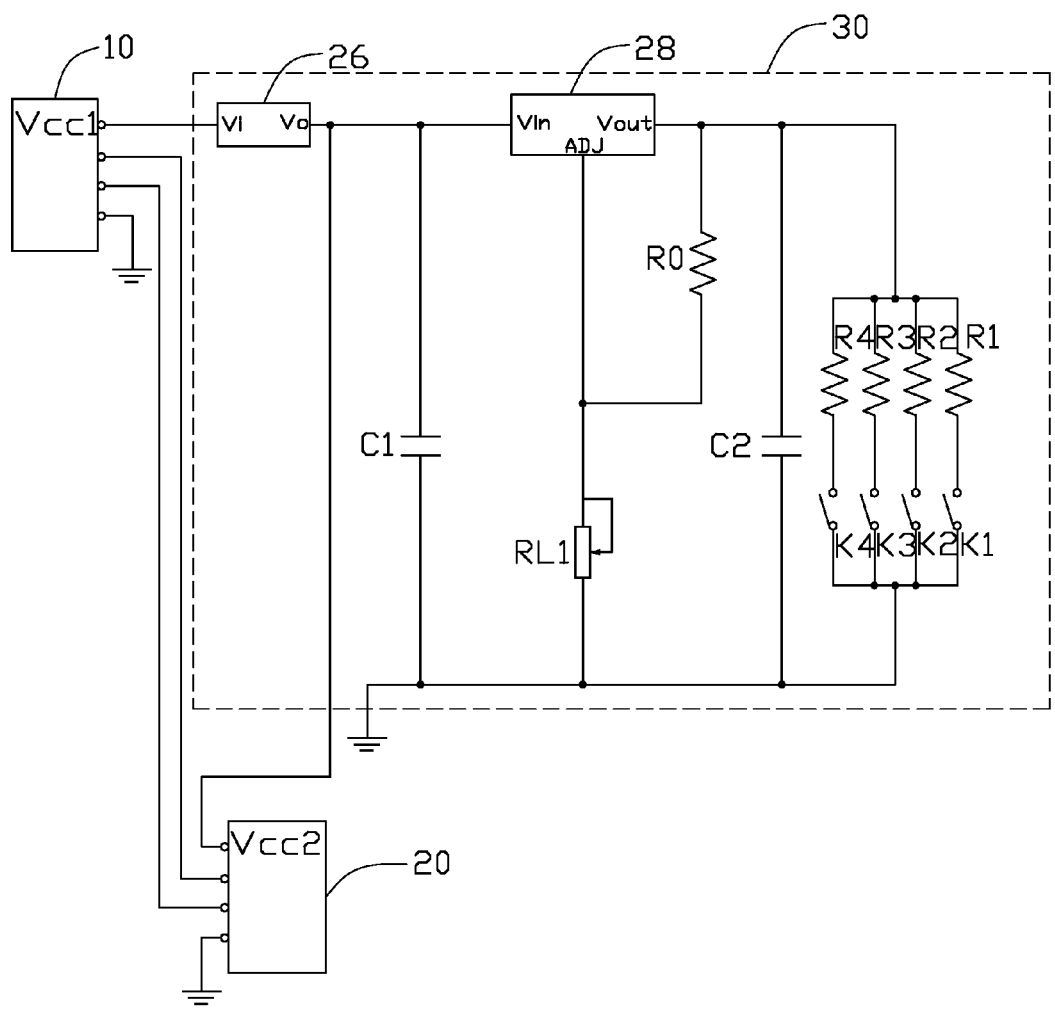
FIG. 2 is a circuit diagram for the apparatus of FIG. 1.

Referring to FIGS. 1 and 2, a power testing apparatus for a USB interface in accordance with an exemplary embodiment of the present invention includes a first USB interface 10, a second USB interface 20, and a simulation apparatus 30. A plurality of buttons A, B, C, D, etc. are set on the simulation apparatus 30. In this embodiment, the number of buttons is four. The first USB interface 10 is configured to connect to a USB interface of a circuit board. The second USB interface 20 is configured to connect to a USB device, such as a USB mouse, a USB keyboard, etc. The simulation apparatus 30 can selectively supply different levels of electrical current by operation of the buttons A, B, C, or D. As a result, the power testing apparatus can test a USB interface of the circuit board under different power configurations.

The simulation apparatus 30 includes voltage regulators 26 and 28, capacitors C1 and C2, resistor R0, variable resistor RL1, a plurality of load resistors R1-R4, and a plurality of switches K1-K4. In this embodiment, the type of the voltage regulator 26 is AT1201_; S25. The voltage regulator 26 includes an input terminal Vi and an output terminal Vo. The type of the voltage regulator 28 is LM338. The voltage regulator 28 includes an input terminal Vin, an output terminal Vout, and an adjusting terminal ADJ.

Signal pins of the first USB interface 10 are correspondingly connected to signal pins of the second USB interface 20. A voltage pin Vcc1 of the first USB interface 10 is connected to the input terminal Vi of the voltage regulator 26. The output terminal Vo of the voltage regulator 26 is connected to a voltage pin Vcc2 of the second USB interface 20 and the input terminal Vin of the voltage regulator 28, and is grounded via the capacitor C1. The output terminal Vout of the voltage regulator 28 is grounded via the capacitor C2 and connected to a common terminal of the load resistors. The load resistors R1, R2, R3, and R4 each are connected to its corresponding switches K1, K2, K3, and K4 in series, and then connected between Vout and ground in parallel. The resistor R0 is connected between the output terminal Vout and the adjusting terminal ADJ of the voltage regulator 28. The adjusting terminal ADJ of the voltage regulator 28 is grounded via the variable resistor RL1.

In this embodiment, the resistance of the resistor R0 is 120; ohms. The maximum resistance of the variable resistor RL1 is 30K ohms. When one switch is closed, the load resistor corresponding to the switch is used. For example, when the switch K1 is closed, the load resistor R1 is used. The voltage regulator 26 is used for reducing noise and stabilizing voltage. The capacitor C1 is used for filtering. The capacitor C2 is used for stabilizing circuit. The voltage regulator 26, and the capacitors C1 and C2 can be omitted to reduce manufacturing cost.

The switches K1, K2, K3, and K4 correspond to, and are controlled by, the buttons A, B, C, and D.

According to characteristics of the voltage regulator 28, when the input terminal Vin of the voltage regulator 28 receives a voltage from the voltage pin Vcc2 of the second USB interface, a reference voltage is generated between output terminal Vout and the adjusting terminal ADJ of the voltage regulator 28. The reference voltage is, for example, 1.25; volts. The output voltage V2 of the voltage regulator 28 is determined according to the following formula:

$$V2=1.25*(1+RL1/R0) \qquad (1)$$

When the resistances of the resistor R0 and the variable resistor RL1 are set, the output voltage V2 is set. The output voltage V2 can be changed by adjusting the resistance of the variable resistor RL1.

For example, we assume that only the load resistor R1 is used and the resistance, current, and power of the load resistor R1 are Rm, Im, and P. when the resistance of the resistor R0 is 120; ohms, the resistance of the variable resistor RL1 is 20; Kohms, the current of the USB device is 450; milli-amperes, and the current of the fully loaded power of the USB interface is 500; milli-amperes, the current Im is 50mA, according to the following formula:

$$P=(Im)^2*Rm=[1.25*(1+RL1/R0)]^2/Rm \qquad (2)$$

The Rm=4.2; Kohms. In use, when the button A is pressed, the current Im and the current of the USB device are equal to 500; milli-amperes. Therefore, the power testing apparatus can test the USB interfaces of an electronic device.

The current of the switches K2, K3, and K4 can be selected to be 100; milli-amperes, 200; milli-amperes, and 400; milli-amperes according to need. Therefore, the resistances of the load resistor R2, R3, and R4 are 2.1; Kohms, 1.1; Kohms, and 0.5 Kohms according to the formulas (2).

The current Im can be selected according to need. The number of the load resistors and the switches can also be selected according to need.

When the USB interface of the circuit board need to be tested, the buttons A, B, C, and D are selectively pressed according to the current of the USB device. The USB interface of the circuit board will gain the fully loaded power. The testing apparatus is simple, and low-cost.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A power testing apparatus for a USB interface, comprising:
    a first USB interface to connect to a USB interface of a circuit board which is to be tested;
    a second USB interface to connect to a USB device; and
    a simulation apparatus comprising:
        a first voltage regulator comprising an input terminal, an output terminal, and an adjusting terminal;
        a first resistor connected between the output terminal and the adjusting terminal of the first voltage regulator;
        a second resistor connected between the adjusting terminal of the first voltage regulator and ground; and
        a load resistor connected to the output terminal of the first voltage regulator and ground;
    wherein signal pins of the first USB interface are correspondingly connected to signal pins of the second USB interface, a voltage pin of the first USB interface is connected to a voltage pin of the second USB interface and the input terminal of the first voltage regulator.

2. The power testing apparatus as claimed in claim 1, wherein the simulation apparatus further comprises a second voltage regulator; the second voltage regulator comprises an input terminal and an output terminal, the input terminal of the second voltage regulator is connected to the voltage pin of the first USB interface, the output terminal of the second voltage regulator is connected to the voltage pin of the second USB interface.

3. The power testing apparatus as claimed in claim 2, wherein the simulation apparatus further comprises a first capacitor and a second capacitor, the first capacitor is connected between the output terminal of the second voltage regulator and ground, the second capacitor is connected between the output terminal of the first voltage regulator and ground.

4. The power testing apparatus as claimed in claim 1, wherein the second resistor is a variable resistor.

5. A power testing apparatus for USB interface, comprising:
    a first USB interface to connect to a USB interface of a circuit board which is to be tested;
    a second USB interface to connect to a USB device; and
    a simulation apparatus comprising:
        a first voltage regulator comprising an input terminal, an output terminal, and an adjusting terminal;
        a first resistor connected between the output terminal and the adjusting terminal of the first voltage regulator;
        a second resistor connected between the adjusting terminal of the first voltage regulator and ground; and
        two or more load resistors connected in parallel, each of the load resistors connected to a switch in series between the output terminal of the first voltage regulator and ground;
    wherein signal pins of the first USB interface are correspondingly connected to signal pins of the second USB interface, a voltage pin of the first USB interface is connected to a voltage pin of the second USB interface and the input terminal of the first voltage regulator.

6. The power testing apparatus as claimed in claim 5, wherein the simulation apparatus further comprises a second voltage regulator, the second voltage regulator comprises an input terminal and an output terminal, the input terminal of the second voltage regulator is connected to the voltage pin of the first USB interface, the output terminal of the second voltage regulator is connected to the voltage pin of the second USB interface.

7. The power testing apparatus as claimed in claim 6, wherein the simulation apparatus further comprises a first capacitor and a second capacitor, the first capacitor is connected between the output terminal of the second voltage regulator and ground, the second capacitor is connected between the output terminal of the first voltage regulator and ground.

8. The power testing apparatus as claimed in claim 5, wherein the number of the two or more load resistors connected in parallel is four.

9. The power testing apparatus as claimed in claim 8, wherein the resistances of the first resistor and the second resistor are 120 ohms and 20 Kohms, the resistances of the four load resistors are 4.2 Kohms, 2.1 Kohms, 1.1 Kohms, and 0.5 Kohms.

10. The power testing apparatus as claimed in claim 5, wherein the second resistor is a variable resistor.

* * * * *